(12) United States Patent
Arens

(10) Patent No.: US 12,256,514 B2
(45) Date of Patent: Mar. 18, 2025

(54) POWER MODULE WITH INTEGRATED GATE DRIVER AND FUNCTIONAL COMPONENTS WITHIN A SINGLE POWER MODULE HOUSING

(71) Applicant: Infineon Technologies AG, Neubiberg (DE)

(72) Inventor: Andre Arens, Rüthen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 696 days.

(21) Appl. No.: 17/537,959

(22) Filed: Nov. 30, 2021

(65) Prior Publication Data
US 2023/0170791 A1    Jun. 1, 2023

(51) Int. Cl.
| H02H 7/00 | (2006.01) |
| H01L 23/04 | (2006.01) |
| H05K 7/14 | (2006.01) |
| H02M 1/32 | (2007.01) |
| H02M 7/00 | (2006.01) |
| H02M 7/66 | (2006.01) |

(52) U.S. Cl.
CPC ......... *H05K 7/1432* (2013.01); *H01L 23/04* (2013.01); *H02M 1/327* (2021.05); *H02M 7/003* (2013.01); *H02M 7/66* (2013.01)

(58) Field of Classification Search
None
See application file for complete search history.

(56) References Cited

U.S. PATENT DOCUMENTS

| 6,490,162 | B2 * | 12/2002 | Siu | H01L 23/4093 |
| | | | | 174/548 |
| 9,107,331 | B2 * | 8/2015 | Lo Presti | H05K 7/1432 |
| 11,362,014 | B2 * | 6/2022 | Liu | H01L 23/4334 |
| 2009/0231810 | A1 * | 9/2009 | Liang | H01L 23/473 |
| | | | | 361/699 |
| 2014/0374629 | A1 | 12/2014 | Huang et al. | |
| 2017/0064808 | A1 | 3/2017 | Rizza et al. | |
| 2017/0294373 | A1 * | 10/2017 | Rowden | H01L 23/142 |
| 2018/0337475 | A1 | 11/2018 | Teichmann et al. | |

OTHER PUBLICATIONS

Partial European Search Report relating to Corresponding Application No. 22205806.7; Apr. 21, 2023; 13 Pgs.
Semikron, "SKiip Technology", https://www.semikron.com/innovation-technology/packaging-technology/skiip-technology.html, retrieved Oct. 19, 2022, 5 pages.

* cited by examiner

*Primary Examiner* — Stephen W Jackson
(74) *Attorney, Agent, or Firm* — Cooper Legal Group LLC

(57) ABSTRACT

An apparatus comprises a power module housing. The power module housing includes a conductive substrate and a circuit board positioned overlying the conductive substrate. A gate driver is mounted to the circuit board. A power device is mounted to the conductive substrate and is controlled by the gate driver. The power module housing includes an insulation material electrically insulating the conductive substrate from the circuit board. A monitoring component is mounted to at least the conductive substrate and is operatively coupled to the gate driver and the power device.

20 Claims, 8 Drawing Sheets

POWER MODULE WITH INTEGRATED GATE DRIVER AND FUNCTIONAL COMPONENTS WITHIN A SINGLE POWER MODULE HOUSING

TECHNICAL FIELD

The present disclosure relates to the field of power modules, power devices, and gate drivers.

BACKGROUND

Present day intelligent power modules (IPMs) including both logic components, such as one or more gate drivers, and various power devices inside a single housing, which are typically used in, for example, white goods and similar applications. Industrial power modules, which are used in various industrial applications such as for frequency conversion, for power conversion equipment such as uninterruptable power supplies, industrial motor drives, embedded motor drives, AC-DC power supplies, etc. are typically driven by an external gate driver that is housed outside of housing of the power module. The gate driver and any additional logic components are typically placed outside of the power module due to the fact that power devices require improved insulation compared to present day IPMs. Such external placements require a lot of space, which could be saved if the logic components necessary to control the power module were integrated into the housing of the power module. Accordingly, it would be beneficial to enable IPMs for industrial applications, for example, to provide industrial IPMs.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises a power module housing. The power module housing includes a conductive substrate and a circuit board positioned overlying the conductive substrate. The power module housing includes an insulation material electrically insulating the conductive substrate from the circuit board. The power module housing includes a gate driver mounted to the circuit board. The power module housing includes at least one power device mounted to the conductive substrate and is controlled by the gate driver. The power module includes a monitoring component mounted at least to the conductive substrate and is operatively coupled to the gate driver and the power device.

In an embodiment of the techniques presented herein, an apparatus is provided. The apparatus comprises a power module housing. The power module housing includes a conductive substrate and a circuit board positioned adjacent to the conductive substrate. The power module housing includes an insulation material electrically insulating the conductive substrate from the circuit board. The power module housing includes a gate driver mounted to the circuit board. The power module housing includes a power device mounted to the conductive substrate and is controlled by the gate driver. The power module includes a monitoring component mounted at least to the conductive substrate and is operatively coupled to the gate driver and the power device.

In an embodiment of the techniques presented herein, an apparatus is provided. The apparatus comprises a power module housing. The power module housing includes a conductive substrate and a circuit board separate from the conductive substrate. The power module housing includes an insulation material electrically insulating the conductive substrate from the circuit board. The power module housing includes a gate driver mounted to the circuit board. The power module housing includes a power device mounted to the conductive substrate and is controlled by the gate driver. The power module includes a monitoring component mounted to the conductive substrate and is operatively coupled to the gate driver and the switch.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
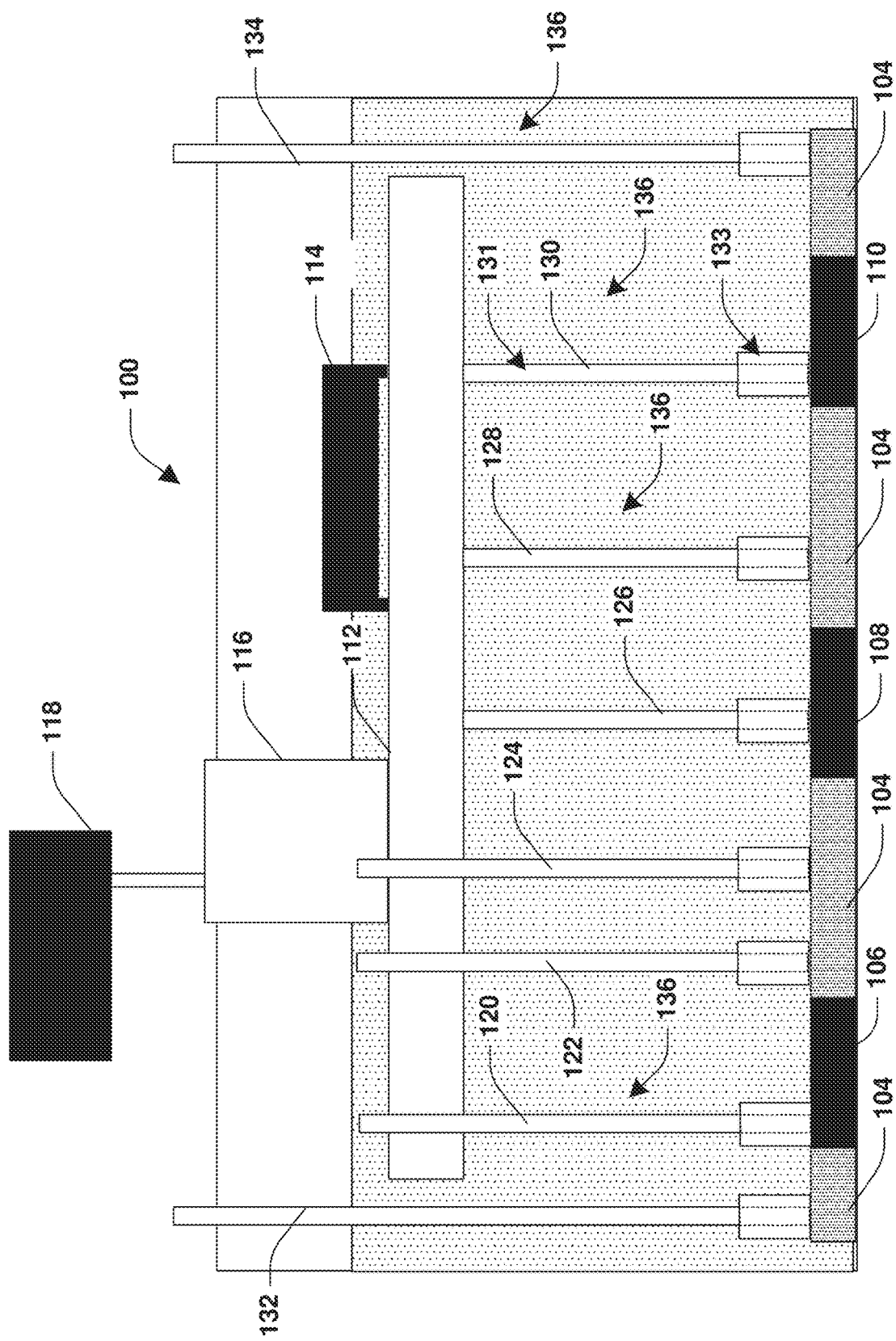
FIG. 1 is a component block diagram illustrating an apparatus with a gate driver and monitoring components integrated within a power module housing in accordance with the techniques presented herein.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, a power module is provided that integrates a gate driver and additional monitoring components into a single power module housing of the power module. Generally, power modules do not provide this level of integration within a single power module housing. In particular, a power module may merely include power semiconductors such as switches, insulated-gate bipolar transistors (IGBTs), metal-oxide-semiconductor field-effect transitions (MOSFETs), etc. A gate driver that controls these power semiconductors is located external to the power module housing. For example, the gate driver may be mounted to a circuit board that is within an external housing that is separate and external to the power module housing. Additional monitoring components are also housed external to the power module housing of the power module. These monitoring components may relate to overcurrent protection devices, temperature protection devices, current measurement devices, voltage measurement devices, and/or other protection features. Because the monitoring components are external to the power module housing, additional connection pins are required. These additional connection pins must be placed as close as possible to the power semiconductors due to magnetic coupling. The additional connection pins and the additional external housings for the gate driver and monitoring components increases cost, size, and complexity.

In contrast to these power modules that have little to no integration of various components and functionality, the apparatuses provided herein have a higher level of integration within a single power module housing. In particular, a gate driver such as a galvanically isolated gate driver, power devices such as power switches or thyristors driven by the gate driver, and monitoring components are integrated together within the same power module housing. The gate driver may be mounted to a circuit board within the power module housing. The power devices, and monitoring components may be mounted to a conductive substrate (e.g., integrated into the conductive substrate at a chip level). In some embodiments, the conductive substrate may comprise a direct copper bonded board (DCB board) or an integrated metal substrate (IMS) board. The circuit board and the conductive substrate are mounted within the power module housing such that the circuit board and the conductive substrate are separated from one another and are not directly touching one another.

The power module housing may comprise an insulation material, which may comprise a potting gel such as silicone gel, an insulative soft potting material, etc. The insulation material electrically insulates the conductive substrate from the circuit board in order to mitigate interference from inductances, couplings, cross talk, or other issues that can occur due to the relatively high operating voltage of the conductive substrate. In some embodiments, the conductive substrate may operate at voltages between about 1.2 kV and 5 kV or any other voltage. In contrast, the circuit board and components mounted to the circuit board may operate at a much lower voltage such as between about 3.3V and 5V. Thus, the circuit board and components mounted to the circuit board would be damaged by the high voltage of the conductive substrate. Such damage is mitigated by separating the conductive substrate and the circuit board, and by electrically insulating the conductive substrate and the circuit board using the insulation material.

Various monitoring components may be integrated into the power module housing with the gate driver. These monitoring components may at least be integrated into the conductive substrate and may provide various functions such as overcurrent protection and/or over-temperature protection at a chip level, current measurement, voltage measurement, temperature measurement, and/or other functionality. The ability to integrate the monitoring components, power devices and the gate driver into a single power module housing of a power module reduces the overall size, complexity, and cost because such components are not housed external to the power module housing. The size of the power module housing may be kept relatively small because the insulation material allows for both the circuit board and the conductive substrate to be located within the power module housing within close proximity to one another without interference from inductances, couplings, cross talk, or other issues. For example, the power module housing may measure between 30 mm×30 mm to 100 mm×100 mm. Additionally, the use of the insulation material ensures that the high operating voltage of the conductive substrate and components on the conductive substrate do not damage the circuit board and components on the circuit board that operate at a much lower voltage.

FIG. 1 illustrates a cross-sectional view of a power module housing 100. The power module housing 100 includes a conductive substrate 104. In some embodiments, the conductive substrate 104 comprises a conductive material, such as copper. In some embodiments, the conductive substrate 104 comprises a direct copper bonded (DCB) board or an insulated metal substrate (IMS) board. In some embodiments, the conductive substrate 104 may be located on one side of the power module housing 100, such as a bottom side of the power module housing 100. It may be appreciated that the conductive substrate 104 may be located anywhere inside the power module housing 100.

The power module housing 100 includes a circuit board 112. In some embodiments, the circuit board 112 is positioned separate from the conductive substrate 104 such that the circuit board 112 does not directly touch the conductive substrate 104. In some embodiments, the circuit board 112 is located overlaying (e.g., above) but not touching the conductive substrate 104. The circuit board 112 and the conductive substrate 104 are both located within the power module housing 100 but are separated from one another because the circuit board 112 and the conductive substrate 104 operate at different voltages that could otherwise cause damage. In particular, the conductive substrate 104 may operate at a relatively high voltage such as between about 1.2 kV and about 5 kV or any other voltage that is higher than a voltage of the circuit board 112 that operates at voltages between about 3.3V and 5V or any other voltage. The higher voltage of the conductive substrate 104 can damage the circuit board 112, and thus the conductive substrate 104 is positioned separate from the circuit board 112.

To further insulate the circuit board 112 and the conductive substrate 104 so that the circuit board 112 and the conductive substrate 104 can be co-located within the power module housing 100, an insulation material 136 may be included within the power module housing 100. In some embodiments, the insulation material 136 may partially fill an inside cavity of the power module housing 100. In some embodiments, the insulation material 136 may completely fill the inside cavity of the power module housing 100. In some embodiments, the insulation material 136 comprises a potting gel, such as a silicone material, a silicone gel material, an insulation potting material, or any other insulation material.

In embodiments, in which the circuit board 112 is located overlaying the conductive substrate 104, the distance between the circuit board 112 and the conductive substrate 104 may be relatively short, such as 3 mm, due to the electric insulation provided by the insulation material 136. During operation of the power module, the temperature of the conductive substrate 104 may increase. Depending on the distance between the circuit board 112 and the conductive substrate 104, the temperature increase of the conductive substrate 104 may lead to an increase of the temperature of the circuit board 112, which may cause the temperature of the circuit board 112 to reach or exceed a junction temperature of the components mounted on the circuit board 112. Accordingly, even if a very short distance between the circuit board 112 and the conductive substrate 104 is possible due to the insulation material 136, the distance between the circuit board 112 and the conductive substrate 104 may be wider to avoid thermal coupling. For example, in one embodiment, the distance necessary for electrical insulation between the circuit board 112 and the conductive substrate 104 may be 3 mm while the distance necessary for thermal insulation may be 5 mm. Consequently, the distance between the circuit board 112 and the conductive substrate 104 may be 5 mm. As can be seen from this example, the distance between the circuit board 112 and the conductive substrate 104 is chosen to satisfy both electrical and thermal requirements.

In some embodiments, one or more devices may be mounted to the circuit board 112. These devices may operate within a voltage range supported by the circuit board 112 such as between about 3.3V to about 5V or some other voltage achieved using various voltage modification components. In some embodiments, a gate driver 114 may be mounted to the circuit board 112. In some embodiments, the gate driver 114 may comprise a galvanically isolated gate driver or other type of gate driver. The gate driver 114 may be controlled by an external controller 118 that is located external to (outside) the power module housing 100. The external controller 118 may connect to the gate driver 114 through a circuit board connector 116 that provides communication from the circuit board 112 to components located external to the power module housing 100 such as the external controller 118. The external controller 118 may be configured to generate pulse width modulation signals used to control the gate driver 114. These pulse width modulation signals may be transmitted from the external controller 118 through the circuit board connector 116 and the circuit board 112 to the gate driver 114.

The gate driver 114 may be operatively coupled to and configured to control the gate of one or more power devices mounted to (e.g., integrated within at a chip level) the conductive substrate 104, such as a power device 110 and/or other power semiconductors not illustrated. For example, the power device 110 may comprise a switch or a thyristor mounted to or integrated within the conductive substrate 104. The gate driver 114 may control a gate of the power device 110, for example, in order to open or close a switch or to change a mode of a thyristor. In some embodiments, a conductive connector 130 connects the gate driver 114 to the power device 110, and the insulation material 136 is formed around the conductive connector 130 and otherwise electrically insulates the gate driver 114 from the power device 110.

In some embodiments, conductive connectors 120-134 may be used to provide connectivity between components within the power module housing 100 and connectivity outside the power module housing 100. For example, conductive connector 132 and conductive connector 134 are connected to the conductive substrate 104 and extend through the power module housing 100 to outside the power module housing 100. External components may be connected to the conductive connector 132 and conductive connector 134 so that the external components can communicate (e.g., send and receive electrical signals) with components mounted to or integrated within the conductive substrate 104. Conductive connector 120 connects at least a part of a first monitoring component 106 to the circuit board 112. Conductive connector 126 connects at least a part of a second monitoring component 108 to the circuit board 112. Conductive connector 122, conductive connector 124, and conductive connector 128 connect the conductive substrate 104 to the circuit board 112 so that components mounted to the circuit board 112 can communicate (e.g., send and receive electrical signals) with the components mounted to or integrated within the conductive substrate 104. The insulation material 136 may be formed around the conductive connectors 120-134 and between the circuit board 112 and the conductive substrate 104.

In some embodiment, the conductive connectors 120-134 may comprise a conductive material, such as copper. In some embodiments, the conductive connectors 120-134 comprise press-fit pins. A press-fit pin, such as the conductive connector 130 comprises press-fit section 131 and a contact hole 133. The press-fit section 131 includes at least one of the following CuFeP; CuZr; CuCrZr; CuMg; CuCrTiSi; CuCrAgFeTiSi; and CuNiSiMg. The contact hole 133 may be part of or connected to the conductive substrate 104. The press-fit section 131 is pressed into the contact hole 133 so that the press-fit section 131 is plastically deformed, and one end of the press-fit section 131 both mechanically and electrically contacts the conductive substrate 104 such as to form a connection with the power device 110. The other end of the press-fit section 131 is electrically connected to the circuit board 112 such as to form a connection with the gate driver 114. In this way, the gate driver 114 is operatively (electrically) connected to the power device 110 by the conductive connector 130 (the press fit pin).

In some embodiments, bond wires may be used to form electrical connections instead of the conductive connectors 120-134. The bond wires may connect to the conductive substrate 104 and then extend up and around the circuit board 112 in order to connect on top of the circuit board 112. In this embodiment, a length of the circuit board 112 may be shorter than a length of the conductive substrate 104 so that the bond wires can go up and around the edges of the circuit board 112.

In some embodiments, one or more monitoring components may be mounted at least to (e.g., integrated within such as at a chip level) the conductive substrate 104, such as the first monitoring component 106, the second monitoring component 108, and/or other monitoring components not illustrated. A monitoring component may be operatively coupled to the gate driver 114, the power device 110, other power semiconductors integrated within the conductive substrate 104, other monitoring components integrated within the conductive substrate 104, the circuit board 112, or other components mounted to the circuit board 112.

In some embodiments, the monitoring components, the conductive substrate 104, the circuit board 112, and the gate driver 114 are all integrated and housed within the same single power module housing 100. The insulation material 136 is used to mitigate interference from inductances, couplings, cross talk, or other issues due to the relatively higher operating voltage of the conductive substrate 104 and components mounted to (integrated within) the conductive substrate 104 (e.g., 1.2 kV and 5 kV or any other voltage)

compared to the relatively lower operating voltage (e.g., 3.3V to 5V) of the circuit board 112, the gate driver 114, and/or other components mounted to the circuit board 112. Electrical insulation provided by the insulation material 136 enables the ability to integrate current measurement functionality, voltage measurement functionality, temperature measurement functionality, an internal power supply, over-temperature protection, overcurrent protection, a rectifier, and/or other functionality of monitoring components into the power module housing 100.

In some embodiments, the power module housing comprises an internal power supply mounted to the conductive substrate 104 that provides power to one or more monitoring components, power devices, and/or other components mounted on (integrated within) the conductive substrate 104. Further, the internal power supply provides power to the gate driver mounted on the circuit board 112 and in particular provides a voltage that the gate driver requires to control a gate of the power device 110, which may, for example, be 15 V in some embodiments.

In some embodiments, a monitoring component comprises a current measurement device used to measure current values associated with one more power devices, and/or other components mounted on (integrated within) the conductive substrate 104. The current measurement device may be used by a component mounted to the circuit board 112 in order to obtain current measurements within the conductive substrate 104. In an example, the current measurement device may comprise an integrated current mirror (a current sense). In some embodiments, a monitoring component comprises a voltage measurement device used to measure voltage values associated with one more monitoring components, switches, power semiconductors, and/or other components mounted on (integrated within) the conductive substrate 104. The voltage measurement device may be used by a component mounted to the circuit board 112 in order to obtain voltage measurements within the conductive substrate 104. In some embodiments, a monitoring component comprises a temperature measurement device (e.g., a temperature dependent diode or resistor on chip within the conductive substrate 104) used to measure temperature values associated with one more power devices, and/or other components mounted on (integrated within) the conductive substrate 104.

In some embodiments, a monitoring component comprises an overcurrent protection device used to switch off one or more power devices, and/or other components mounted on (integrated within) the conductive substrate 104 based upon a current measurement exceeding a threshold value. In this way, the overcurrent protection device may provide current protection at a chip level. In some embodiments, a monitoring component comprises a temperature protection device used to switch off one or more power devices, and/or other components mounted on (integrated within) the conductive substrate 104 based upon a temperature measurement exceeding a threshold value. In this way, the temperature protection device may provide over-temperature protection at a chip level. In some embodiments, the temperature protection device, the overcurrent protection device, and/or other protective circuits may be suitable for IGBTs and/or MOSFETs, and may include integrated current mirror (a current sense) or integrated temperature measurement (e.g., a temperature dependent diode or resistor on chip or in the conductive substrate 104).

Figure 2:
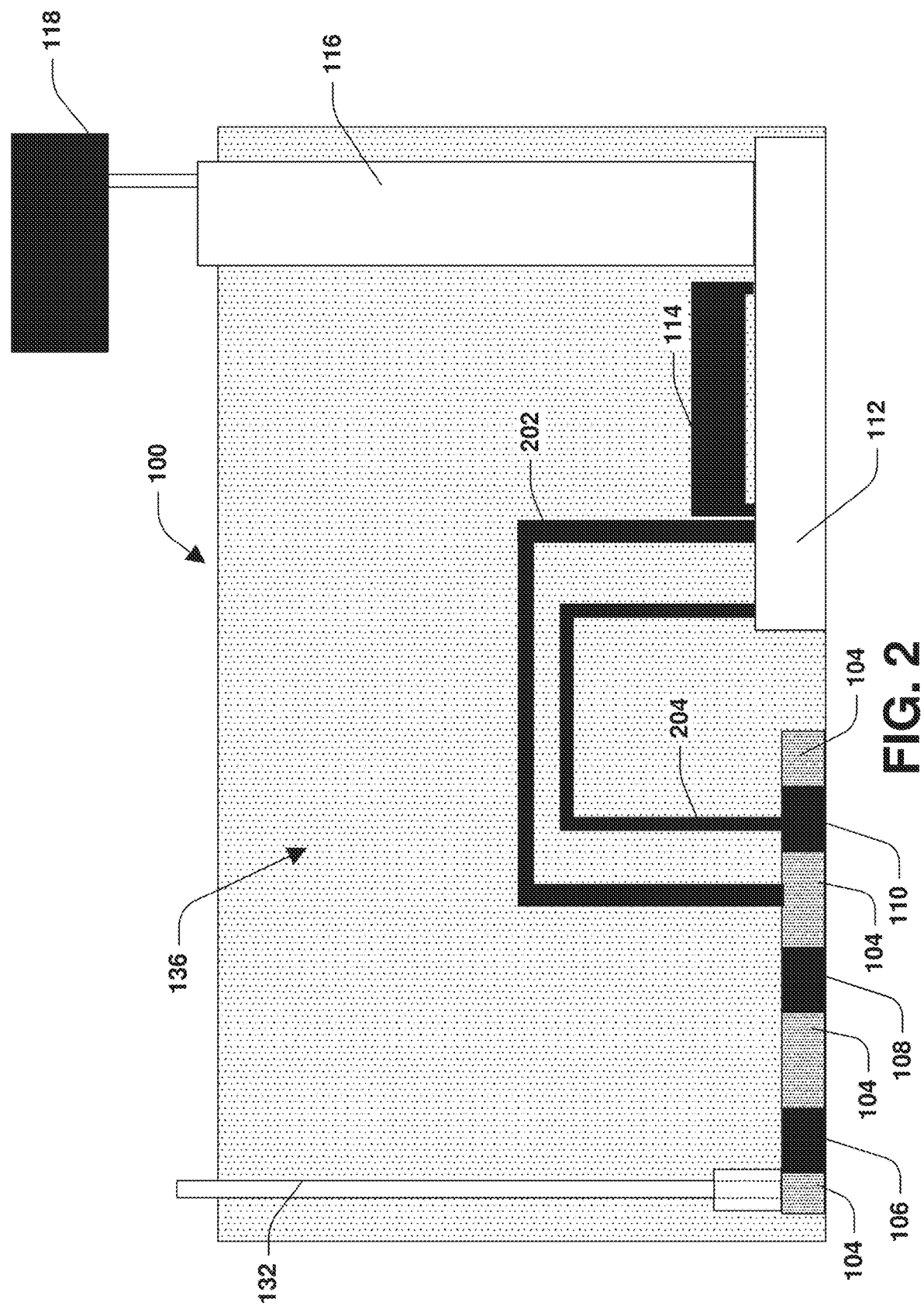
FIG. 2 is a component block diagram illustrating an apparatus with a gate driver and monitoring components integrated within a power module housing in accordance with the techniques presented herein.

The circuit board 112 and the conductive substrate 104 may be positioned within the power module housing 100 according to various configurations. In some embodiments, the circuit board 112 may be positioned adjacent the conductive substrate 104, as illustrated by FIG. 2. The insulation material 136 is formed between the circuit board 112 and the conductive substrate 104 to provide electrical insulation between the circuit board 112 and the conductive substrate 104. In order to provide connectivity between the circuit board 112 and the conductive substrate 104, such as between the gate driver 114 and the power device 110, one or more bond wires are used. For example, a first bond wire 202 may be connected between the conductive substrate 104 and the circuit board 112. A second bond wire 204 may be connected between the power device 110 and the circuit board 112. The bond wires may comprise a cooper material.

Figure 3:
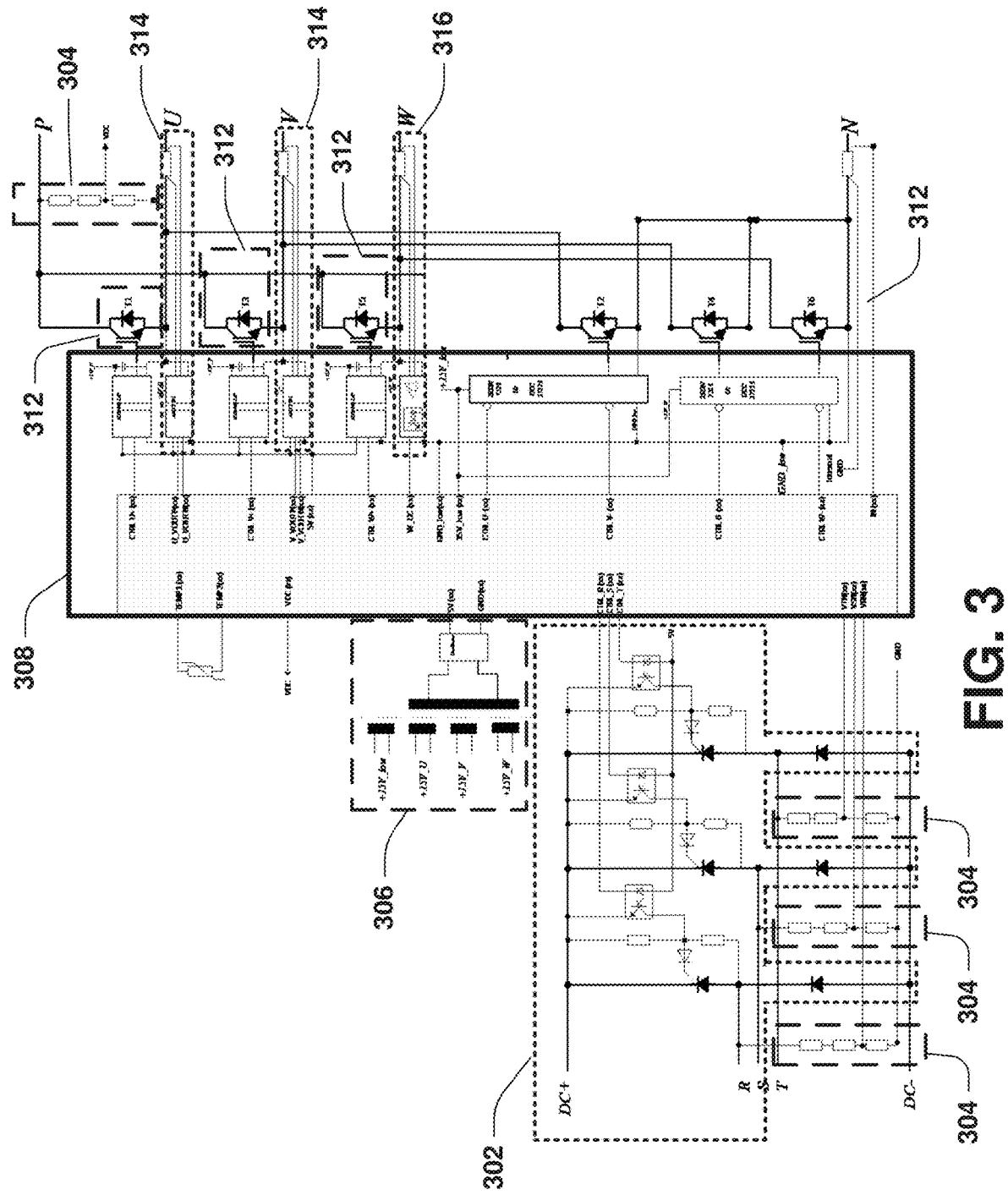
FIG. 3 is a component block diagram illustrating connectivity between a gate driver and monitoring components integrated within a power module housing in accordance with the techniques presented herein.

FIG. 3 illustrates a system overview showing various components that may be integrated into the power module housing 100. In some embodiments, the power module housing 100 includes a control circuit 308, which may be mounted to the circuit board 112. As shown here, control circuit 308 is a six-channel gate driver. In some embodiments, the control circuit 308 may include six single channel gate drivers or three dual-channel gate drivers or any combination thereof. In some embodiments, the at least one power device is part of a plurality of power devices 312 implementing a controlled three phase rectifier 302 that operates based upon control signals CTRL_R, CRTL_S, and CRTL_T. In some embodiments, the monitoring components comprise voltage measurement devices 304, which may be configured to measure various voltages within the power module housing 100 such VTN, VSN, VRN, and VDC. In some embodiments, the power module housing comprises an internal power supply 306 that may provide power to the control circuit 308 and to various components within the power module housing 100. In some embodiments, the monitoring components comprise current measurement components 314, such as shunts to measure AC current. In some embodiments, the monitoring components comprise an overcurrent detection device 316. These monitoring components may be mounted to (integrated within) the conductive substrate 104 and may be connected to the control circuit 308.

Figure 4:
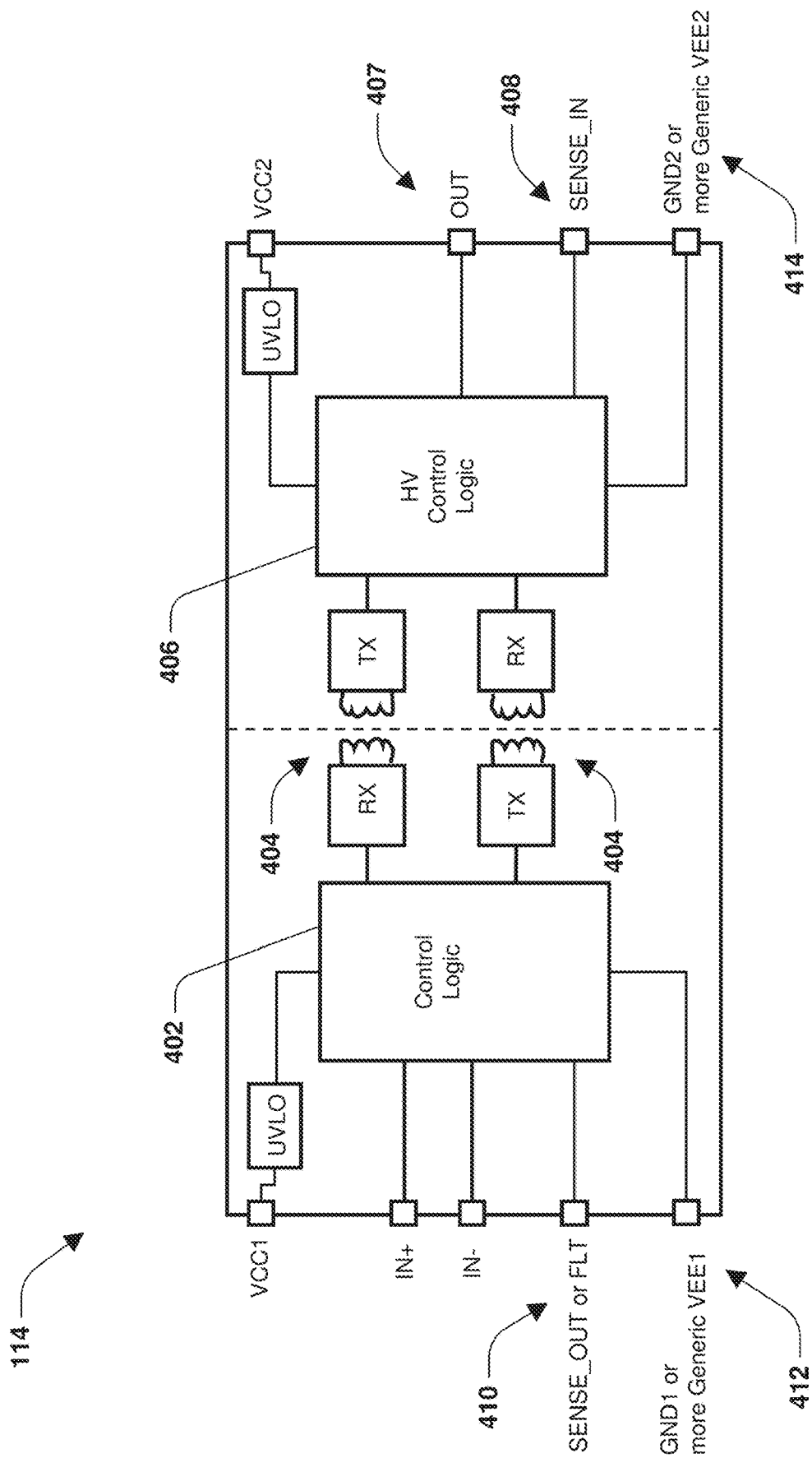
FIG. 4 is a component block diagram illustrating a gate driver in accordance with the techniques presented herein.

FIG. 4 illustrates an example of the gate driver 114. The gate driver 114 may comprise control logic 402 on an input side of the gate driver 114. The gate driver 114 may comprise high voltage (HV) control logic 406 at an output side of the gate driver 114, which provides control signals to the power device 110 via the OUT pin 407. The gate driver 114 comprises transmission and receiver elements 404, which may be combined into a single transceiver setup. Transmission between the input side and the output side of the gate driver 114 through the transmission and receiver elements 404 can be capacitive or inductive through a coreless transformer. The gate driver 114 may comprise a sense out pin 410 or FLT, which depends on whether the gate driver 114 actually conveys a signal representing a sense parameter or determines that a fault condition is present. The gate driver 114 may comprise a sense input pin 408 that may be coupled to components mounted at least to (integrated within) the conductive substrate 104, such as monitoring components. The gate driver 114 may comprise a ground 412 on the input side and a ground 414 on the output side.

In some embodiments, a monitoring component may be configured to provide a signal indicative of a parameter of a power device (e.g., a measured current parameter, a measured temperature parameter, etc.) to the gate driver 114 through the sense input pin 408. The signal is processed by the control logic 402, which may perform an operation based upon the signal such as an operation to turn off the power device based upon the parameter of the power device (e.g., a measured current parameter exceeding a threshold, a measured temperature parameter exceeding a threshold, etc.). In some embodiments, the monitoring component may provide the signal indicative of the parameter of the power device to the gate driver 114 through the sense input pin 408. The gate driver 114 may provide the signal to an external controller, such as through the sense output 410.

Figure 5A:
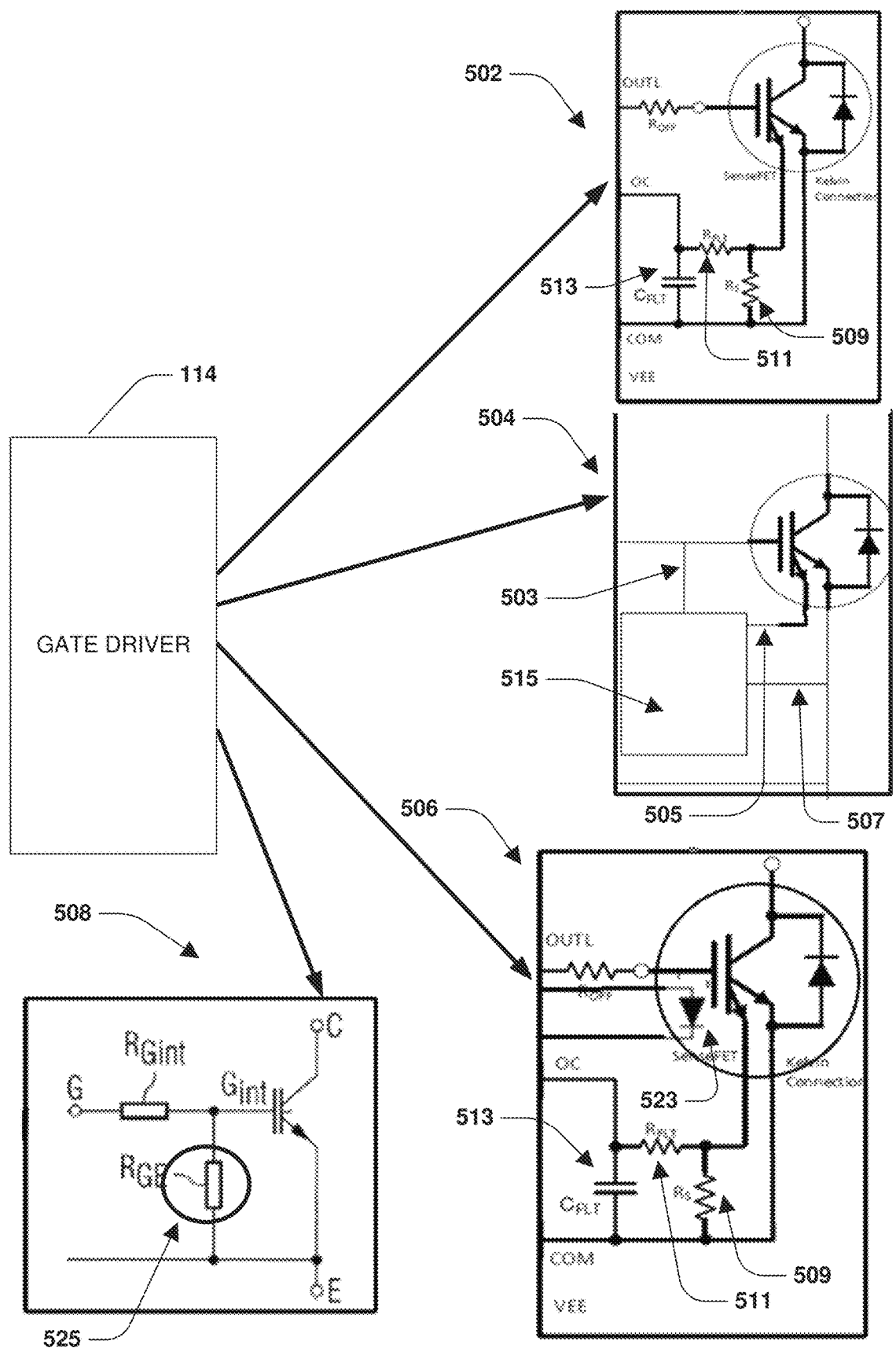
FIG. 5A is a component block diagram illustrating an apparatus with a gate driver and monitoring components integrated within a power module housing in accordance with the techniques presented herein.

FIG. 5A illustrates an example of the gate driver 114 connected to various monitoring components that are mounted to (integrated within) the conductive substrate 104, such as a first monitoring component 502, a second monitoring component 504, a third monitoring component 506, and/or a fourth monitoring component 508 that may provide safety features. The first monitoring component 502 utilizes current sense functionality (e.g., current sense resistance) to determine whether to shut down a gate current in response to a measured current exceeding a threshold. In this way, the first monitoring component 502 provides overcurrent protection. The third monitoring component 506 is similar to the first monitoring component 506 except that the third monitoring component 506 has further includes a diode 523 arranged inside the power device. A forward voltage of the diode 523 is temperature dependent, and is measured by the gate driver 114, thereby enabling temperature monitoring in addition to current monitoring.

In particular, first monitoring component 502 and/or the third monitoring component 506 includes or may be coupled to a power device with a current sense output, which is coupled to a sense resistance $R_s$ 509. Monitoring components 502, 506 may further include a resistor $R_{FLT}$ 511 forming a voltage divider with sense resistance $R_s$ 509 and a capacitor $C_{FLT}$ 513. If capacitor $C_{FLT}$ 513 is provided, then the monitoring components 502, 506 may merely output a signal indicative of the load current to the gate driver once capacitor $C_{FLT}$ 513 has been charged, in some embodiments.

In some embodiments, components $R_s$ 509, $R_{FLT}$ 511, and $C_{FLT}$ 513 may be mounted on the circuit board 112 while some of conductive connectors 120 to 130 (electric connections) provide the connection between the current sense output of the power device mounted on the conductive substrate 104.

The second monitoring component 504 provides overcurrent protection. The monitoring component 504 includes an SC Detect circuit 515, which is coupled to a power device with current sense capability as described with regard to monitoring component 502. SC Detect circuit 515 is coupled between a gate terminal and an emitter/source potential of the power device. SC Detect circuitry 515 may be configured to turn off the power device as discussed in the following with reference to FIG. 5B. In some embodiments, the monitoring component 504 may provide self protection functionality where the monitoring component 504 is configured to turn off the power device based upon a parameter of the power device (e.g., a measured current parameter exceeding a threshold, a measured temperature parameter exceeding a threshold, etc.).

Figure 5B:
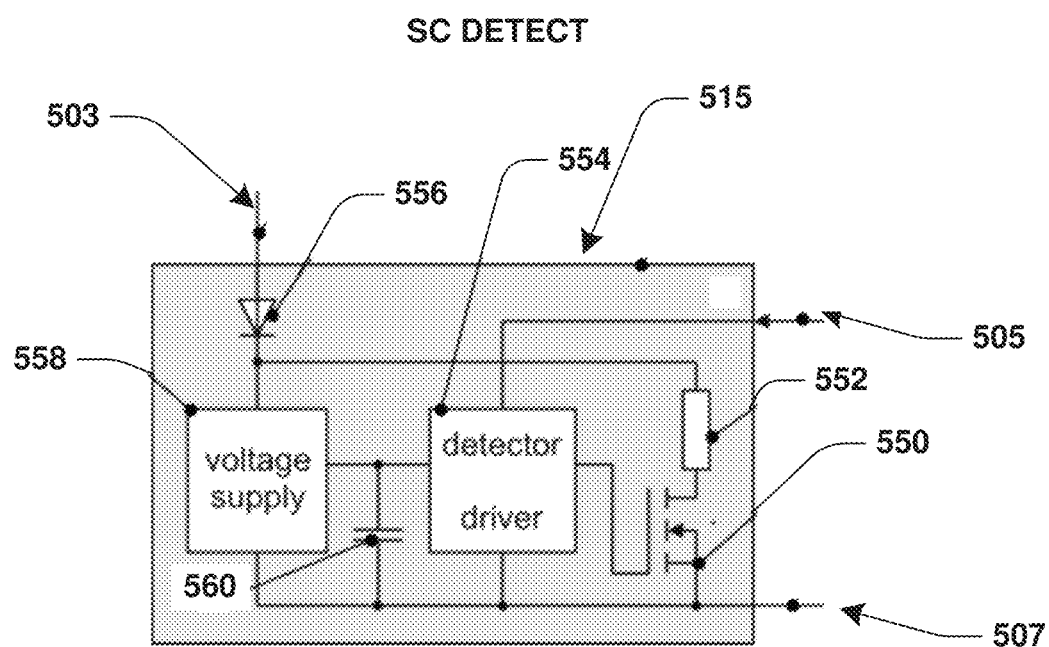
FIG. 5B is a component block diagram illustrating SC detect circuitry.

As shown in FIG. 5B, in some embodiments, the SC Detect circuitry 515 may comprise SC detect functionality 554, a voltage supply 558 that supplies power to the SC detect functionality 554 based on a gate voltage of the power device and a switch 550. If the current at the current sense pin of the power device exceeds a threshold value, then the SC detect functionality 554 closes switch 550, thereby coupling the gate terminal of the power device to the emitter/source potential of the power device, which turns off the power device. The SC detect circuitry 515 may comprise a diode 556, which prevents a current flow via transistor 521 into the gate terminal or the OUT terminal of the gate driver. The SC detect circuitry 501 may further comprise resistance 552, capacitance 560, and a switch 550. Connections 503, 505 and 507 of SC detect circuitry 515 may connect to the corresponding connections of monitoring component 504.

In some embodiments, SC Detect circuit 515, transistor 521 and diode 519 may be mounted on the circuit board 112 with electric connections such as conductive connectors 120 to 130 providing the connections between the current sense output of the power device and SC detect circuit as well as between the anode of diode 519 and the gate terminal of the power device.

The fourth monitoring component 508 provides temperature sensing (e.g., through a temperature dependent diode or resistor). As shown in FIG. 5A, the fourth monitoring component 508 includes a temperature dependent resistor 525, which may be mounted on the conductive substrate 104 to provide an accurate measurement of the temperature of the conductive substrate 104 or is placed inside a power device as a polysilicon resistor between a gate and source/emitter for providing a small leakage current therebetween, which can be measured by the gate driver 114 but does not impact performance of the power device.

Figure 6:
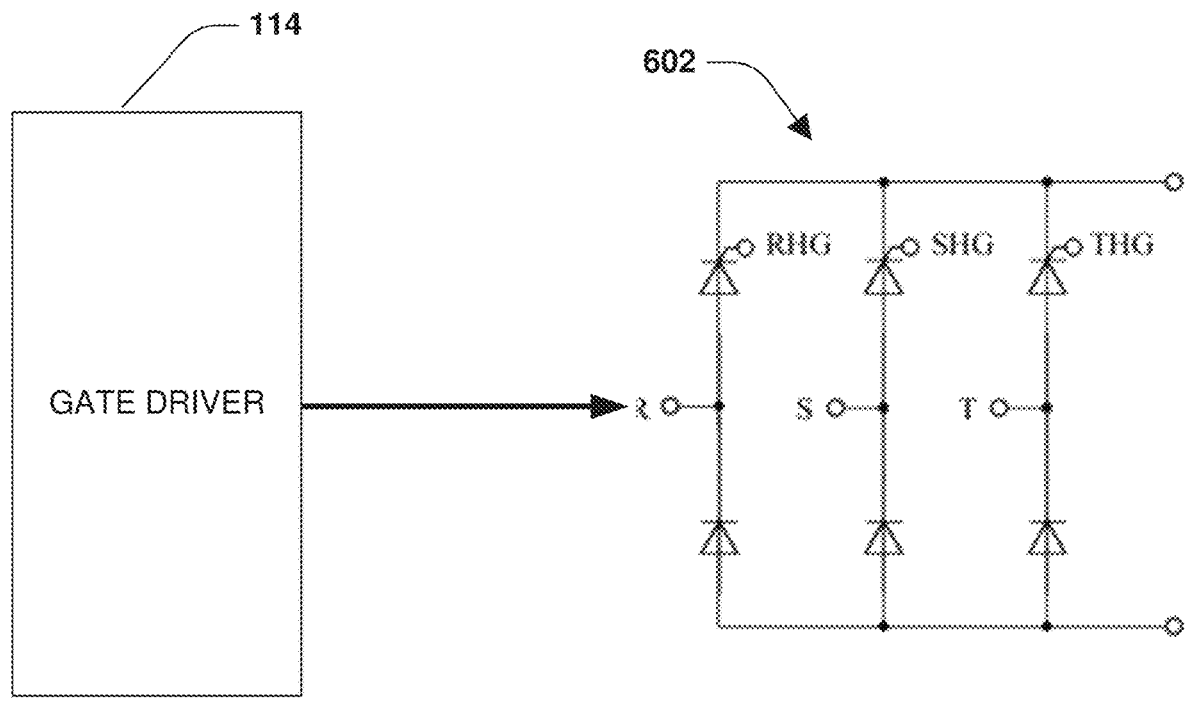
FIG. 6 is a component block diagram illustrating an apparatus with a gate driver and monitoring components integrated within a power module housing in accordance with the techniques presented herein.

FIG. 6 illustrates an example of the gate driver 114 connected to a plurality of power devices 602 that are mounted to (integrated within) the conductive substrate 104. The plurality of power devices 602 may comprise a rectifier comprised of 6 thyristors that may provide full inversion for 3 phases.

Figure 7:
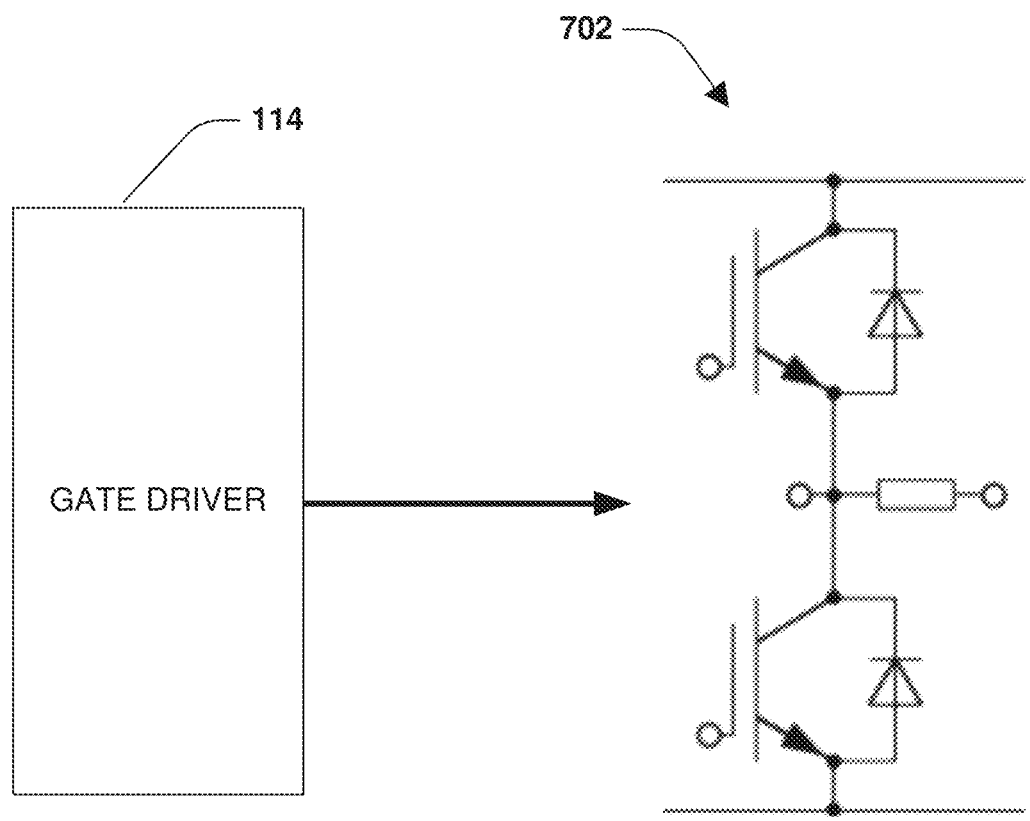
FIG. 7 is a component block diagram illustrating an apparatus with a gate driver and monitoring components integrated within a power module housing in accordance with the techniques presented herein.

FIG. 7 illustrates an example of the gate driver 114 connected to a plurality of power devices and a monitoring component that are mounted to (integrated within) the conductive substrate 104. Gate driver 114 may be coupled to two power devices forming a half-bridge. A shunt, for regulation and control of the output of the half-bridge (e.g., the phase current or phase voltage), is integrated into an output node of the half-bridge. In some embodiments, the shunt may be formed on the conductive substrate 104. In some embodiments, the shunt may be formed on the printed circuit board 112.

An embodiment of the presently disclosed techniques comprises an apparatus. The apparatus comprises a power module housing including: a conductive substrate; a circuit board positioned overlying the conductive substrate; an insulation material electrically insulating the conductive substrate from the circuit board; a gate driver mounted to the circuit board; at least one power device mounted to the conductive substrate and controlled by the gate driver; and a monitoring component mounted to at least the conductive substrate and operatively coupled to the gate driver and the power device.

According to some embodiments, the monitoring component is configured to turn off the at least one power device based on a parameter of the at least one power device.

According to some embodiments, the monitoring component is configured to provide a signal indicative of a parameter of the at least one power device to the gate driver and wherein the gate driver is configured to turn off the at least one power device.

According to some embodiments, the monitoring component is configured to provide a signal indicative of a parameter of the at least one power device to the gate driver and wherein the gate driver is configured to provide the signal to an external controller.

According to some embodiments, the conductive substrate comprises one of a direct copper bonded (DCB) board and an insulated metal substrate (IMS) board.

According to some embodiments, the insulation material comprises a potting gel.

According to some embodiments, the apparatus comprises a conductive connector electrically coupling the gate driver to at least one power device, wherein the insulation material is formed around the conductive connector and electrically insulates the gate driver from the power device.

According to some embodiments, the apparatus comprises a conductive connector electrically coupling the conductive substrate to the circuit board, wherein the insulation material is formed around the conductive connector.

According to some embodiments, the apparatus comprises a conductive connector electrically coupling the monitoring component to the circuit board, wherein the insulation material is formed around the conductive connector and electrically insulates the circuit board from the monitoring component.

According to some embodiments, the apparatus comprises a circuit board connector coupled to the circuit board and providing connectivity outside the power module housing.

According to some embodiments, the circuit board operates at a first voltage level and the conductive substrate operates at a second voltage level higher than the first voltage level.

According to some embodiments, the monitoring component comprises an overcurrent protection device.

According to some embodiments, the overcurrent protection device is formed by components on the conductive substrate, a conductive connector between the conductive substrate and the circuit board and components on the circuit board.

According to some embodiments, the monitoring component comprises a temperature protection device.

According to some embodiments, the apparatus comprises a plurality of power devices mounted on the conductive substrate, the plurality of power devices implementing one of a half bridge, a full bridge, a three-phase inverter, a rectifier, or a converter from AC to DC or AC or from DC to DC or AC.

According to some embodiments, the monitoring component comprises a current measurement device or a voltage measurement device.

According to some embodiments, the apparatus comprises an internal power supply mounted on the conductive substrate and providing power to at least the gate driver.

An embodiment of the presently disclosed techniques comprises an apparatus. The apparatus comprises a power module housing including: a conductive substrate; a circuit board positioned adjacent the conductive substrate; an insulation material electrically insulating the conductive substrate from the circuit board; a gate driver mounted to the circuit board; a power device mounted to the conductive substrate and controlled by the gate driver; and a monitoring component mounted to at least the conductive substrate and operatively coupled to the gate driver and the power device.

An embodiment of the presently disclosed techniques comprises an apparatus. The apparatus comprises a power module housing including: a conductive substrate; a circuit board positioned within the power module housing separate from the conductive substrate; an insulation material electrically insulating the conductive substrate from the circuit board; a gate driver mounted to the circuit board; a power device mounted to the conductive substrate and controlled by the gate driver; and a monitoring component mounted at least to the conductive substrate and operatively coupled the gate driver and the power device.

According to some embodiments, the monitoring component comprise at least one of a current measurement device, a voltage measurement device, a temperature protection device, an overcurrent protection device, or a rectifier.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
 a power module housing including:

a conductive substrate;
a circuit board positioned overlying the conductive substrate, wherein the circuit board operates at a first voltage level and the conductive substrate operates at a second voltage level higher than the first voltage level;
an insulation material electrically insulating the conductive substrate from the circuit board;
a gate driver mounted to the circuit board;
at least one power device mounted to the conductive substrate and controlled by the gate driver; and
a monitoring component mounted to at least the conductive substrate and operatively coupled to the gate driver and the power device.

2. The apparatus of claim 1, wherein the monitoring component is configured to turn off the at least one power device based on a parameter of the at least one power device.

3. The apparatus of claim 1, wherein the monitoring component is configured to provide a signal indicative of a parameter of the at least one power device to the gate driver and wherein the gate driver is configured to turn off the at least one power device.

4. The apparatus of claim 1, wherein the monitoring component is configured to provide a signal indicative of a parameter of the at least one power device to the gate driver and wherein the gate driver is configured to provide the signal to an external controller.

5. The apparatus of claim 1, wherein the conductive substrate comprises one of a direct copper bonded (DCB) board and an insulated metal substrate (IMS) board.

6. The apparatus of claim 1, wherein the insulation material comprises a potting gel.

7. The apparatus of claim 1, comprising:
a conductive connector electrically coupling the gate driver to the at least one power device, wherein the insulation material is formed around the conductive connector and electrically insulates the gate driver from the power device.

8. The apparatus of claim 1, comprising:
a conductive connector electrically coupling the conductive substrate to the circuit board, wherein the insulation material is formed around the conductive connector.

9. The apparatus of claim 1, comprising:
a conductive connector electrically coupling at least part of the monitoring component to the circuit board, wherein the insulation material is formed around the conductive connector and electrically insulates the circuit board from the monitoring component.

10. The apparatus of claim 1, comprising:
a circuit board connector coupled to the circuit board and providing connectivity outside the power module housing.

11. The apparatus of claim 1, wherein the monitoring component comprises an overcurrent protection device.

12. The apparatus of claim 1, comprising an internal power supply mounted on the conductive substrate and providing power to at least the gate driver.

13. An apparatus, comprising:
a power module housing including:
a conductive substrate;
a circuit board positioned overlying the conductive substrate;
an insulation material electrically insulating the conductive substrate from the circuit board;
a gate driver mounted to the circuit board;
at least one power device mounted to the conductive substrate and controlled by the gate driver; and
a monitoring component mounted to at least the conductive substrate and operatively coupled to the gate driver and the power device, wherein the monitoring component is configured to provide a signal indicative of a parameter of the at least one power device to the gate driver and wherein the gate driver is configured to provide the signal to an external controller.

14. The apparatus of claim 13, wherein the circuit board operates at a first voltage level and the conductive substrate operates at a second voltage level higher than the first voltage level.

15. An apparatus, comprising:
a power module housing including:
a conductive substrate;
a circuit board positioned overlying the conductive substrate;
an insulation material electrically insulating the conductive substrate from the circuit board;
a gate driver mounted to the circuit board;
at least one power device mounted to the conductive substrate and controlled by the gate driver;
a monitoring component mounted to at least the conductive substrate and operatively coupled to the gate driver and the power device; and
a conductive connector electrically coupling the conductive substrate to the circuit board, wherein the insulation material is formed around the conductive connector.

16. The apparatus of claim 15, wherein the monitoring component comprises a current measurement device or a voltage measurement device.

17. An apparatus, comprising:
a power module housing including:
a conductive substrate;
a circuit board positioned overlying the conductive substrate;
an insulation material electrically insulating the conductive substrate from the circuit board;
a gate driver mounted to the circuit board;
at least one power device mounted to the conductive substrate and controlled by the gate driver;
a monitoring component mounted to at least the conductive substrate and operatively coupled to the gate driver and the power device; and
a conductive connector electrically coupling at least part of the monitoring component to the circuit board, wherein the insulation material is formed around the conductive connector and electrically insulates the circuit board from the monitoring component.

18. The apparatus of claim 17, wherein the monitoring component comprises at least one of a current measurement device, a voltage measurement device, a temperature protection device, an overcurrent protection device, or a rectifier.

19. An apparatus, comprising:
a power module housing including:
a conductive substrate;
a circuit board positioned overlying the conductive substrate;
an insulation material electrically insulating the conductive substrate from the circuit board;
a gate driver mounted to the circuit board;

at least one power device mounted to the conductive substrate and controlled by the gate driver; and a monitoring component mounted to at least the conductive substrate and operatively coupled to the gate driver and the power device; and an internal power supply mounted on the conductive substrate and providing power to at least the gate driver.

20. The apparatus of claim 19, comprising a plurality of power devices mounted on the conductive substrate, the plurality of power devices implementing one of a half bridge, a full bridge, a three-phase inverter, a rectifier, or a converter from AC to DC or AC or from DC to DC or AC.

* * * * *